United States Patent
Kitamura et al.

(10) Patent No.: US 9,728,473 B2
(45) Date of Patent: Aug. 8, 2017

(54) METHOD OF MANUFACTURING SEMICONDUCTOR DEVICE AND SEMICONDUCTOR MANUFACTURING APPARATUS

(71) Applicant: KABUSHIKI KAISHA TOSHIBA, Tokyo (JP)

(72) Inventors: Masayuki Kitamura, Mie (JP); Atsuko Sakata, Mie (JP); Satoshi Wakatsuki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/635,387

(22) Filed: Mar. 2, 2015

(65) Prior Publication Data
US 2016/0093542 A1    Mar. 31, 2016

(30) Foreign Application Priority Data
Sep. 26, 2014    (JP) .................... 2014-196633

(51) Int. Cl.
| | |
|---|---|
| *H01L 21/66* | (2006.01) |
| *H01L 21/67* | (2006.01) |
| *H01L 21/02* | (2006.01) |
| *H01L 21/285* | (2006.01) |
| *H01L 21/687* | (2006.01) |
| *C23C 16/04* | (2006.01) |
| *C23C 16/455* | (2006.01) |
| *C23C 16/52* | (2006.01) |
| *H01L 21/768* | (2006.01) |

(52) U.S. Cl.
CPC ............ *H01L 22/26* (2013.01); *C23C 16/045* (2013.01); *C23C 16/45502* (2013.01); *C23C 16/52* (2013.01); *H01L 21/02271* (2013.01); *H01L 21/28556* (2013.01); *H01L 21/67253* (2013.01); *H01L 21/68742* (2013.01); *H01L 22/12* (2013.01); *H01L 21/76877* (2013.01)

(58) Field of Classification Search
CPC .................... H01L 22/26; H01L 21/67253
See application file for complete search history.

(56) References Cited

U.S. PATENT DOCUMENTS 5,888,840 A  *  3/1999  Kudo .................. B82Y 20/00
                                                           257/E31.033
2004/0251550 A1   12/2004  Yoda et al.

FOREIGN PATENT DOCUMENTS

| JP | 3-177587 | 8/1991 |
|---|---|---|
| JP | 2982003 | 11/1999 |

(Continued)

*Primary Examiner* — Amar Movva
(74) *Attorney, Agent, or Firm* — Finnegan, Henderson, Farabow, Garrett & Dunner, LLP

(57) ABSTRACT

A method of manufacturing a semiconductor device includes forming a film along a surface of a semiconductor substrate in a first surface area state having a first surface area by supplying a reaction gas at a first flow rate. The method further includes detecting a transition from the first surface area state to a second surface area state having a second surface area different from the first surface area. The method still further includes forming the film by changing the flow rate of the reaction gas from the first flow rate to a second flow rate different from the first flow rate after detecting the transition from the first surface area state to the second surface area state.

18 Claims, 7 Drawing Sheets

(56) References Cited

FOREIGN PATENT DOCUMENTS

| JP | 2006-147695 | 6/2006 |
|----|-------------|--------|
| JP | 2007-239008 | 9/2007 |

* cited by examiner

METHOD OF MANUFACTURING SEMICONDUCTOR DEVICE AND SEMICONDUCTOR MANUFACTURING APPARATUS

CROSS-REFERENCE TO RELATED APPLICATION(S)

This application is based upon and claims the benefit of priority from Japanese Patent Application No. 2014-196633, filed on, Sep. 26, 2014 the entire contents of which are incorporated herein by reference.

FIELD

Embodiments disclosed herein generally relate to a method of manufacturing semiconductor device and a semiconductor manufacturing apparatus.

BACKGROUND

Three-dimensionalization of semiconductor devices may cause an increase in the surface area of the structures formed above the semiconductor substrate during the manufacturing process flow. When forming a film by CVD (Chemical Vapor Deposition) for example, the supply of reaction gas increases as the surface area of the underlying structure becomes greater. Thus, formation of a film above a semiconductor substrate having a large surface area requires a large amount of reaction gas, which in turn increases the cost of semiconductor device manufacturing.

DESCRIPTION

Figure 1:
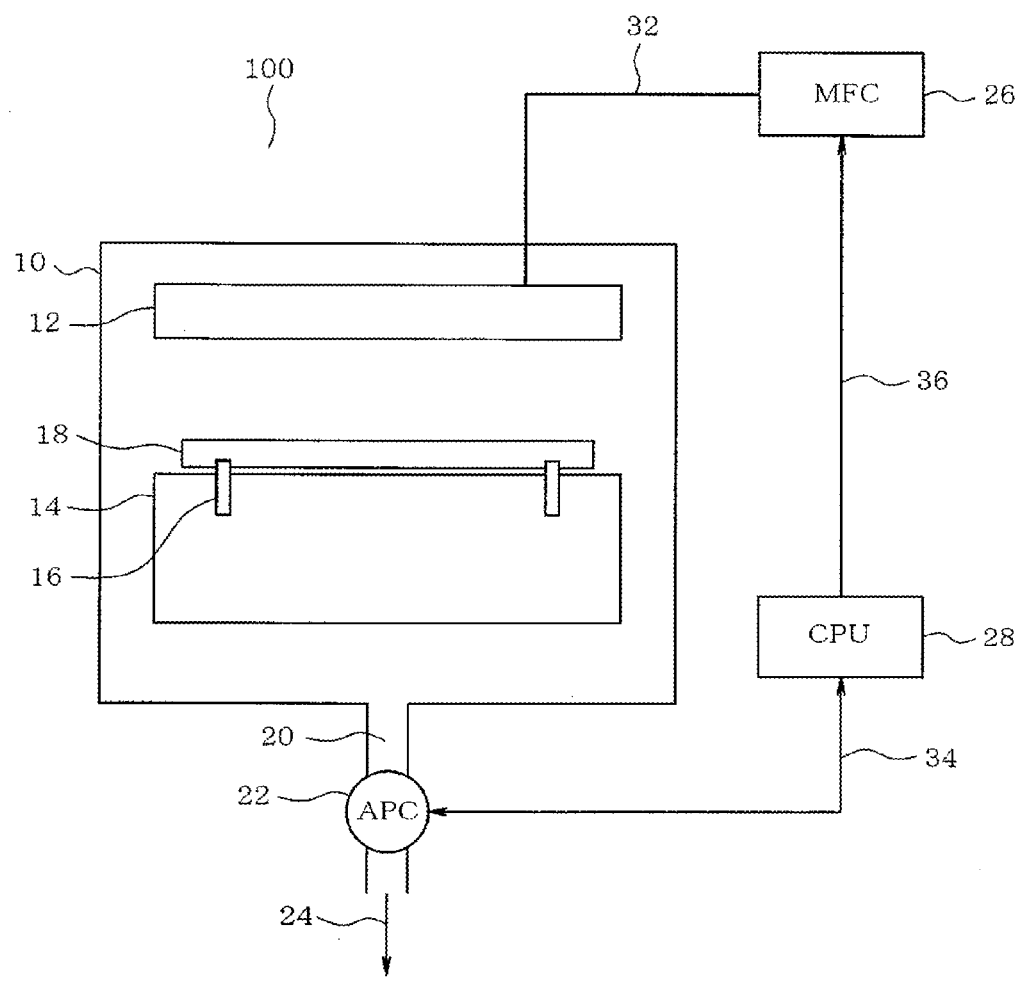
FIG. 1 pertains to a first embodiment and is one example of a view schematically illustrating the structure of a CVD (Chemical Vapor Deposition) apparatus depicted as one example of a semiconductor manufacturing apparatus.

In one embodiment, a method of manufacturing a semiconductor device includes forming a film along a surface of a semiconductor substrate in a first surface area state having a first surface area by supplying a reaction gas at a first flow rate. The method further includes detecting a transition from the first surface area state to a second surface area state having a second surface area different from the first surface area. The method still further includes forming the film by changing the flow rate of the reaction gas from the first flow rate to a second flow rate different from the first flow rate after detecting the transition from the first surface area state to the second surface area state.

In one embodiment, a semiconductor manufacturing apparatus includes a reaction chamber configured to process a semiconductor substrate; amass flow controller configured to control a flow rate of a reaction gas being provided into the reaction chamber; and a controller. The controller is configured to be capable of executing a control to form a film along a surface of the semiconductor substrate so that a surface area of the semiconductor substrate makes a transition from a first state having a first surface area to a second state having a second surface area different from the first surface area. The film is formed by supplying the reaction gas at a first flow rate when in the first state, and after detecting the transition from the first state to the second state, the controller is capable of executing a control to form a film by changing the flow rate of the reaction gas to a second flow rate different from the first flow rate.

EMBODIMENTS

Embodiments are described herein with reference to the accompanying drawings. The drawings are schematic and are not necessarily consistent with the actual relation between thickness and planar dimensions as well as the ratio of thicknesses between different layers, etc. The same element may be illustrated in different dimensions or ratios in different figures. Further, directional terms such as up, down, left, and right are used in a relative context with an assumption that the surface, on which circuitry is formed, of the later described semiconductor substrate faces up and thus, do not necessarily correspond to the directions based on gravitational acceleration. In the drawings referred to in the following description, elements that are identical or similar in function, structure, etc. to those already illustrated or described are identified with identical or similar reference symbols and may not be re-described.

Further, in the following description, an XYZ orthogonal coordinate system is used for convenience of explanation. In the coordinate system, the X direction and the Y direction each indicate a direction parallel to the surface of a semiconductor substrate and crossing one another. The direction crossing both the X direction and the Y direction is referred to as the Z direction.

First Embodiment

FIG. 1 is one example of a schematic view illustrating the structure of semiconductor manufacturing apparatus 100 of the first embodiment. In the first embodiment, semiconductor manufacturing apparatus 100 is described through a CVD (Chemical Vapor Deposition) apparatus application. Semiconductor manufacturing apparatus 100 is provided with reaction chamber 10 hereinafter also referred to as chamber 10, mass flow controller 26 hereinafter also referred to as MFC 26, and central processing unit 28 hereinafter also referred to as CPU 28.

Chamber 10 contains shower head 12 and stage heater 14. Semiconductor substrate 18 may be placed on stage heater 14, in which case, stage heater 14 may serve as a heater for controlling the temperature of semiconductor substrate 18. Lifter pins 16 are provided at the upper portion of stage heater 14. Exhaust tube 20 communicates with the interior of chamber 10. Exhaust tube 20 is provided with automatic pressure controller 22 hereinafter also referred to as APC 22.

Shower head 12 and MFC 26 are interconnected by gas supply tube 32. MFC 26 is configured to control the flow rate of reaction gas. Thus, reaction gas is fed through gas supply tube 32 at a controlled flow rate and supplied into chamber 10 from shower head 12. The gas supplied into chamber 10 forms a film above the surface of semiconductor substrate 18. The reaction gas which was not consumed in the reaction is exhausted, as exhaust gas 24, from chamber 10 through exhaust tube 20.

CPU 28 serves as a controller configured to control various components of semiconductor manufacturing apparatus 100. CPU 28 is provided with a memory portion not illustrated and an interface portion also not illustrated. The memory portion is configured to store various programs and parameters used in the control. The interface portion is configured to establish connection with the components of semiconductor manufacturing apparatus 100 and send/receive various signals to/from the components.

Chamber 10 serves as a reaction chamber for forming one or more films above the surface of semiconductor substrate 18 by CVD. MFC 26 is configured to control the amount of reaction gas being supplied from gas supply tube 32 into chamber 10 through shower head 12. MFC 26 and CPU 23 are interconnected by signal line 36. The amount of gas supply is controlled by MFC 26 based on the instructions provided from CPU 28 through signal line 36.

APC 22 is capable of controlling or adjusting the pressure inside chamber 10. APC 22 is an automatic pressure controller configured to control the pressure inside chamber 10 by varying the flow rate of gas passing through exhaust tube 20. For example, APC 22 is capable of controlling the pressure inside chamber 10 to a predetermined pressure. APC 22 is disposed in the path of exhaust tube 20. A valve may be provided inside APC 22 for example, and APC 22 may be configured to control the flow rate of exhaust gas 24 discharged from exhaust tube 20 by varying the degree of openness of the valve. The degree of openness of the valve provided in APC 22 is also hereinafter simply referred to as the degree of openness, or the opening of APC 22. APC 22 and CPU 28 are interconnected by signal line 34. Information regarding the openness of APC 22 is sent to CPU 28 through signal line 34.

Figure 2A:
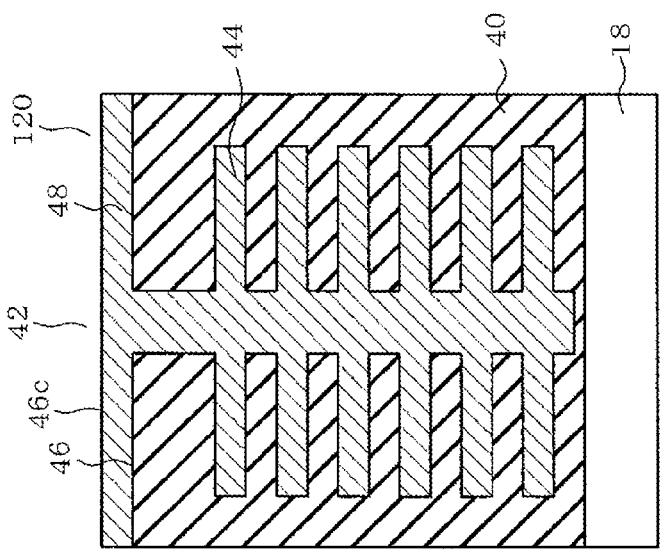
FIGS. 2A, 2B, and 2C pertain to the first embodiment and are examples of vertical cross sectional views describing one example of a sequence of process steps for manufacturing a semiconductor device.
Figure 2B:
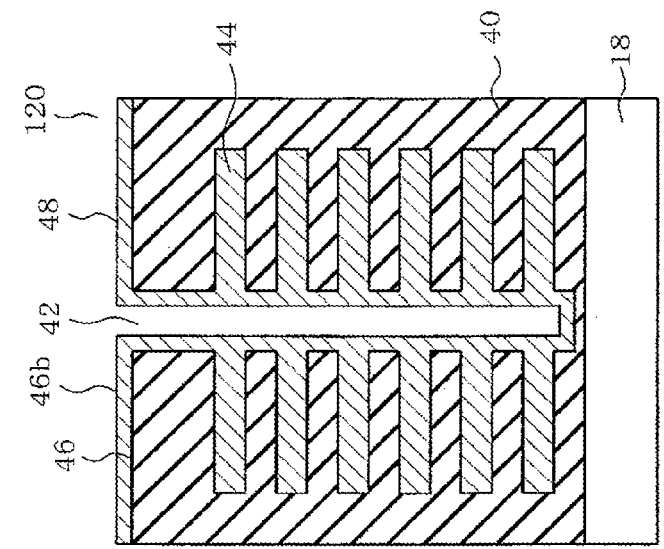
Figure 2C:
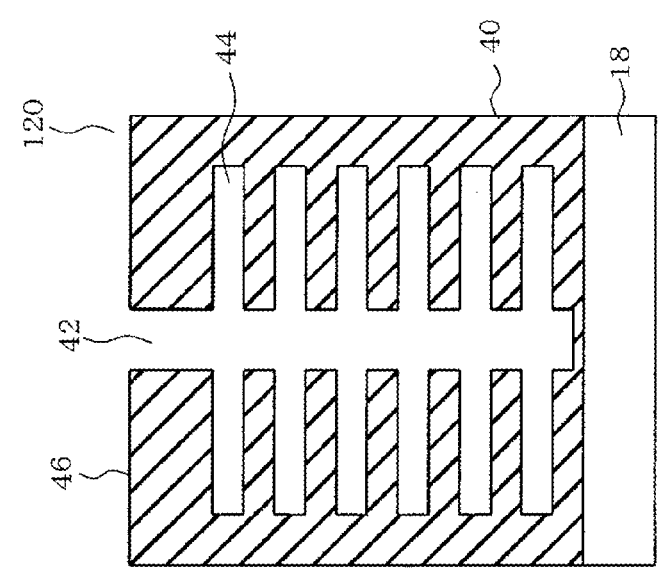

Next, a description will be given on one example of a manufacturing method of a semiconductor device of the first embodiment with reference FIG. 2A, FIG. 2B, and FIG. 2C. FIGS. 2A to 2C are examples of vertical cross sectional views describing one example of a sequence of process steps for manufacturing the semiconductor device of the first embodiment. Further, graph line 50 of the graph in FIG. 3 indicates the variation, i.e. change, in the surface area of semiconductor substrate 18 during the manufacturing process flow of semiconductor device 120.

Semiconductor device 120 includes film 40. Film 40 is formed on semiconductor substrate 18. A silicon substrate may be used for example as semiconductor substrate 18. Film 40 may be an insulating film or a conductive film. Film 40 may also be a stack of films. One example of film 40 may be a stack of a silicon oxide film and a silicon nitride film.

Figure 3:
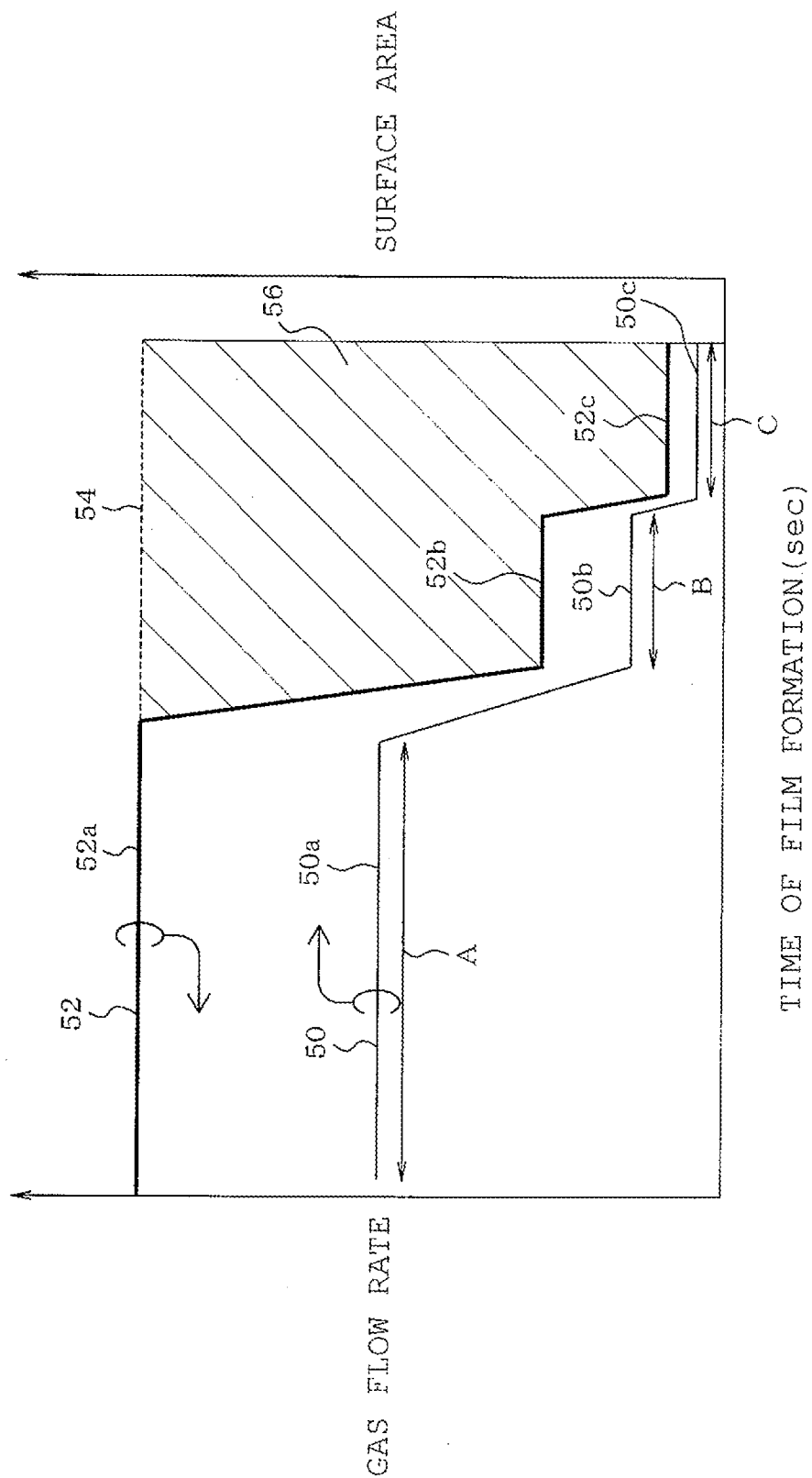
FIG. 3 is a graph indicating examples of a variation observed in the surface area and the gas flow rate during the manufacturing process of a semiconductor device.

Film 40 is provided with trenches 42 and trenches 44. Trenches 42 extend in the up and down direction also referred to as the Z direction. Trenches 44 extend in the left and right direction or the lateral direction also referred to as the X direction and are centered on trenches 42. Trenches 42 and 44 taken together exhibit a cross section looking like a fish bone for example as illustrated in FIGS. 2A, 2B and 2C in which trenches 44 extend in the left and right direction (X direction) so as to be centered on trenches 42 extending in the Z direction. Trenches 42 and trenches 44 are elongate trenches extending into the page in the front and rear direction also referred to as the Y direction as viewed in FIGS. 2A, 2B, and 2C. Trenches 42 and trenches 44 increase the surface area of semiconductor device 120, i.e. the surface area of semiconductor substrate 18 surface. In the embodiments disclosed herein, semiconductor substrate 18 surface is inclusive of film 40. The surface area of semiconductor substrate 18 surface is the sum of surface areas of trenches 42, trenches 44, and the upper surface of CVD film 48. FIG. 2A illustrates a first state. In the first state, the surface area of semiconductor substrate 18 amounts to a first surface area obtained by the sum of the surface areas of trenches 42, trenches 44, and the upper surface of film 40. Film 40 is also herein after referred to as a pre-deposited film. Region A indicated in FIG. 3 represents the first state and the surface area of region A also referred to as the first surface area is indicated by graph line 50a. For example, the first surface area is approximately 50 times the surface area of a flat semiconductor substrate 18.

The cross section shaped like, but not limited to, a fish bone configured by trenches 42 and trenches 44 is an example of a shape having a large surface area. In an alternative embodiment, the cross section may be configured by trenches extending in the up and down direction for example.

Next, CVD film 48 is formed above film 40 having trenches 42 and trenches 44 formed therein as described above. In other words, CVD film 48 is formed above semiconductor substrate 18 in the first state. CVD film 48 may be an insulating film or a conductive film for example. In this example, CVD film 48 is a conductive film comprising tungsten (W). Film formation by CVD is carried out with conditions that provide good coverage. Formation of CVD film 48 above semiconductor substrate 18 in the first state progresses conformally along trenches 42, trenches 44, and surface 46 of film 40.

Then, trenches 44 are filled with CVD Film 48 as illustrated in FIG. 2B. As trenches 44 are filled with CVD film 48, the total surface area of the first state is reduced by the surface area of trenches 44. Because trenches 44 are formed substantially throughout the surface of semiconductor substrate 18, the surface areas of trenches 44 sum up to a significantly large amount. Thus, the total surface area becomes significantly small by the loss of surface area occupied by trenches 44. FIG. 2B illustrates a second state. In the second state, the total surface area of semiconductor substrate 18 amounts to a second surface area obtained by the sum of the surface areas of trenches 42 and the upper surface of surface 46b of CVD film 48. Region B indicated in FIG. 3 represents the second state and the surface area of region B also referred to as the second surface area is indicated by graph line 50b. For example, the second surface area is approximately 5 times the surface area of a flat semiconductor substrate 18.

As the formation of CVD film 48 further progresses, trenches 42 are also filled with CVD film 48 and CVD film 48 is formed further above surface 46 as illustrated in FIG. 2C. Because trenches 42 are filled with CVD film 48, the total surface area of semiconductor substrate 18 is reduced by the surface area of trenches 42. The total surface area of semiconductor substrate 18 surface ultimately becomes substantially equal to the surface area of surface 46c of CVD film 48 covering film 40 and trenches 42 which is in turn substantially equal to the surface area of a flat semiconductor substrate 18 surface. In other words, the total surface area of semiconductor substrate 18 surface become substantially equal to the surface area of a flat semiconductor substrate 18, being approximately one times the surface area of a flat semiconductor substrate 18. FIG. 2C illustrates a third state. In the third state, the total surface area of semiconductor substrate 18 amounts to a third surface area corresponding to the surface area of surface 46c, i.e. the surface area of the planar portion. Region C indicated in FIG. 3 represents the third state and the surface area of region C also referred to as the third surface area is indicated by graph line 50c.

There are no trenches 42 nor trenches 44 in the third state and thus, the formation of CVD film 48 progresses over a flat surface. As a result, the formation of CVD film 48 may progress with a focus on increasing the speed of film formation with less focus on improving coverage. Formation of CVD film 48 in the third state may be accelerated by increasing the temperature of semiconductor substrate 18 by increasing the temperature of stage heater 14. Accelerating CVD film 48 formation allows improvement in the throughput of CVD film 48 formation process.

As the formation of CVD film 48 progresses along the surface of semiconductor substrate 18 provided with trenches 42 and 44, the vertical cross section of semiconductor device 120 changes its shape as illustrated in FIGS. 2A, 2B, and 2C and the surface area of semiconductor device 120 varies as indicated by graph line 50 of FIG. 3. That is, the total surface area of semiconductor device 120 is gradually reduced in the listed sequence of the first surface area represented by graph line 50a, the second surface area represented by graph line 50b, and the third surface area represented by graph line 50c.

FIG. 3 is a graph indicating the relation of the flow rate of reaction gas and the surface area of semiconductor substrate 18 surface. In FIG. 3, the lateral axis indicates the time of film formation, whereas the left vertical axis indicates the gas flow rate of reaction gas used in the film formation and the right vertical axis indicates the total surface area of semiconductor substrate 18 surface. In CVD, the amount (flow rate) of reaction gas used in film formation is correlated with the surface area of semiconductor substrate 18 surface along which the film is to be formed. As described earlier, semiconductor substrate 18 surface is inclusive of the pre-deposited film 40 in which trenches 42 and trenches 44 are formed. This means that the gas flow rate can increase/decrease as the surface area becomes greater/smaller.

As indicated in FIG. 3, the surface area of semiconductor substrate 18 surface represented by graph line 50 is gradually reduced as indicated by graph lines 50a, 50b, and 50c. However, when film formation by CVD is carried out without detecting and considering the variation in the surface area of semiconductor substrate 18 surface, gas is supplied at constant flow rate as indicated by gas flow rate 52 and gas flow rate 54.

However, as the surface area of semiconductor substrate 18 surface is gradually reduced, the amount of gas actually being used exhibits the flow rates indicated by first gas flow rate 52a, second gas flow rate 52b, and third gas flow rate 52c. Excess reaction gas is exhausted without being used in the reaction for causing film formation. Thus, supply of reaction gas exceeding the flow rate of reaction gas required in the film formation results in a waste of reaction gas. In this example, gas amount 56 occupying the region above graph line 52 becomes a waste. In the first embodiment, the flow rate of reaction gas is adjusted in correlation with the detected variation, represented by graph lines 50a, 50b, and 50c of graph line 50, in the total surface area of semiconductor substrate 18 surface where CVD film 48 is formed. First gas flow rate 52a, second gas flow rate 52b, and third gas flow rate 52c representing the gas flow rates used in the actual film formation may be obtained experimentally.

For example, tungsten may be formed by CVD at a pressure of 10,000 Pa and a temperature of 300 degrees Celsius using $WF_6$ (tungsten hexafluoride) as a material gas and $H_2$ (hydrogen) as a reduction gas. The speed of film formation is 0.3 nm/sec for example when the tungsten film is formed above a flat 300 mm semiconductor substrate 180, that is, above semiconductor substrate 18 in the third state having the third surface area.

Figure 4:
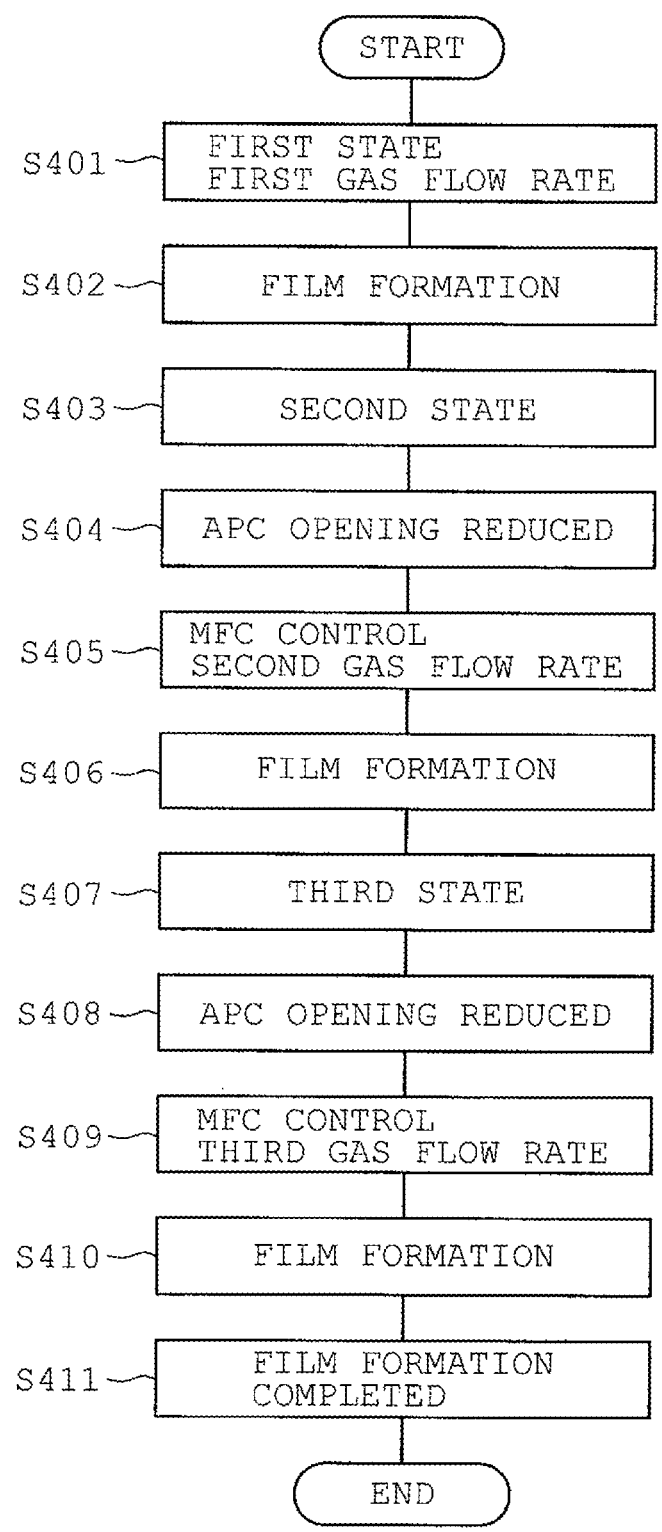
FIG. 4 pertains to the first embodiment and is one example of a flowchart indicating a manufacturing process flow of the semiconductor device.

FIG. 4 is one example of a flow chart indicating the process flow for manufacturing the semiconductor device of the first embodiment. Reference will be made to FIG. 1 to FIG. 3 whenever found appropriate. Reaction gas is supplied into chamber 10 at first gas flow rate 52a with semiconductor substrate 18 surface of semiconductor device 120 in the first state (step S401). The surface of semiconductor substrate 18 is structured as illustrated in FIG. 2A. The surface area of the surface of semiconductor substrate 18 in the first state may be given for example by the sum of the surface areas of trenches 42, trenches 44, and the upper surface of CVD film 48. The surface area of the surface of semiconductor substrate 18 in the first state may also be referred to as a first surface area. In this example, tungsten is used as an example of CVD film 48 formed by CVD. CVD film 48, which is a tungsten film in this example, is formed along the surface of semiconductor substrate 18 which is inclusive of the surface of film 40 including the surfaces of trenches 42 and the surfaces of trenches 44 (step S402).

Then, the surface of semiconductor substrate 18 is placed in the second state illustrated in FIG. 2B as the formation of CVD film 48 progresses (step S403). In the second state, semiconductor device 120 is structured as illustrated in FIG. 2B. The surface area of the surface of semiconductor substrate 18 in the second state may be given for example by the sum of the surface areas of trenches 42 and the upper surface of CVD film 48. The surface area of the surface of semiconductor substrate 18 in the second state may also be referred to as a second surface area. The surface area of the surface of semiconductor substrate 18 is reduced in the second state as compared to the first state.

In the second state, the pressure inside chamber 10 is reduced as will be later described and thus, APC 22 is controlled in the direction to close the valve in order to keep the pressure inside chamber 10 constant. Stated differently, the opening, i.e. the degree of openness of APC 22 is reduced (step S404).

Upon detecting the reduction of APC 22 opening, CPU 28 controls MFC 26 to change the flow rate of reaction gas to second gas flow rate 52b. More specifically, CPU 28 monitors the opening of APC 22 and when determining that the opening of APC 22 has become equal to or less than a predetermined value, CPU 28 sends instructions to MFC 26 through signal line 36 to change the gas flow rate to second gas flow rate 52b. Upon receiving the instructions, MFC 26 executes a control to change the gas flow rate to second gas flow rate 52b (step S405).

Next, a description will be given on how the variation in the opening of APC 22 is fed back to MFC 26. The formation of tungsten by CVD described earlier is driven by the reaction expressed by chemical formula (1) given below which takes place inside chamber 10.

$$WF_6(g) + 3H_2(g) \rightarrow W(s) + 6HF(g) \qquad (1)$$

WF$_6$ and H$_2$ are reaction gases and WF$_6$ serves as a material gas and H$_2$ serves as a reduction gas. In the reaction expressed by formula (1), a total of 4 mol of reaction gas, containing 1 mol of WF$_6$ serving as a material gas and 3 mol of H$_2$ serving as a reduction gas, is introduced into chamber 10. The reaction produces 6 mol of HF when the reaction gas is fully consumed in the reaction. This means that 6 mol of gas is produced when 4 mol of reaction gas is introduced.

Suppose a total of 2000 sccm of reaction gas, containing 500 scorn of material gas (WF$_6$) and 1500 sccm of reduction gas (H$_2$), is supplied to semiconductor substrate 18 in the first state having the first surface area.

As described earlier, the first surface area is approximately 50 times of the surface area of a flat semiconductor substrate 18. The reaction gases being fully consumed in the reaction taking place above semiconductor substrate 18 for forming CVD film 48 will result in 3000 sccm of HF. APC 22 is controlled to a degree of openness corresponding to the gas flow rate of 3000 sccm and thereby keeps the pressure inside chamber 10 constant.

Then, semiconductor substrate 18 surface makes the transition to the second state having the second surface area as the formation of CVD film 48 progresses. Meanwhile, the reaction gas continues to be supplied at the flow rate of 500 sccm for WF$_6$ and 1500 sccm for H$_2$ until the variation, i.e. change, in the opening of APC 22 is detected by CPU 28. The second surface area is approximately five times the surface area of a flat semiconductor substrate 18 as described earlier. As the surface area of semiconductor substrate 18 is reduced from the first surface area to the second surface area, the amount of gas used in the reaction expressed in formula (1) amounts to 50 sccm for WF$_6$ and 150 sccm for H$_2$. The reaction gases unconsumed in the reaction are exhausted as unreacted gas. In the reaction taking place in the second state, 2100 sccm of exhaust gas 24 is exhausted since 300 sccm of HF produced by the reaction of 50 sccm of WF$_6$ and 150 sccm of H$_2$ is also exhausted simultaneously. Thus, in this example, the amount (flow rate) of exhaust gas 24 is reduced from 3000 sccm to 2100 sccm as the surface area is reduced from the first surface area being 50 times the surface area of a flat semiconductor substrate 180 to the second surface area being 5 times the surface area of a flat semiconductor substrate 18, meaning that the pressure inside chamber 10 is reduced. In order to keep the pressure inside chamber 10 constant, a control is executed to reduce the opening of APC 22. That is, when a transition is made from the first state having the first surface area to the second state having the second surface area, the opening of APC 22 is reduced. In this example, opening of APC 22 is reduced by making adjustments in the degree of openness of the valve in the direction to close the valve.

Figure 5:
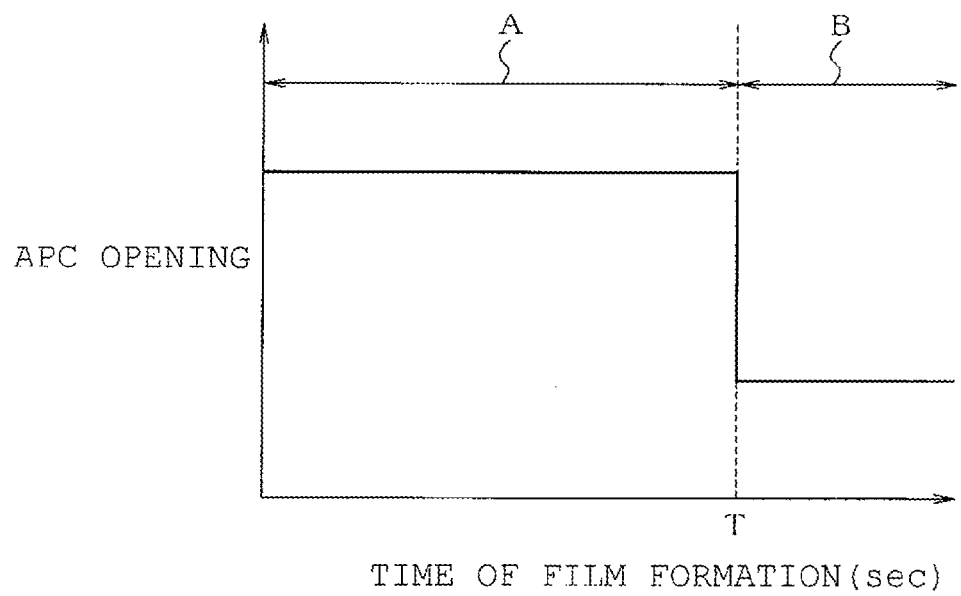
FIG. 5 is one example of a graph schematically indicating a variation observed in the degree of openness, also referred to as an opening, of an APC (Automatic Pressure Controller).

FIG. 5 is one example of a graph schematically indicating the variation in the opening of APC 22. In FIG. 5, the lateral axis represents the time of film formation, the vertical axis represents the APC opening, region A represents the first state having the first surface area, and region B represents the second state having the second surface area. As the result of variation in the flow rate of exhaust gas 24 in the above described manner caused by the variation in the state of semiconductor device 120 from the first state to the second state at time T, the opening of APC 22 is reduced, i.e. changed, in the direction to close the degree of openness of APC 22.

In the first embodiment, CPU 28 is configured to detect the variation in the opening of APC 22. When determining that the opening of APC 22 has become equal to or less than a predetermined degree of openness, CPU 28 is configured to send instructions to MFC 26 to change the gas flow rate from first gas flow rate 52a to second gas flow rate 52b. Upon receiving the instructions, MFC 26 is configured to change the gas flow rate from first gas flow rate 52a to second gas flow rate 52b (step S405).

Next, as the formation of CVD film 48 progresses based on second gas flow rate 52b (step S406), trenches 42 are filled with CVD film 48 to place semiconductor device 120 in the third state (step S407) in which semiconductor substrate 18 surface has the third surface area as illustrated in FIG. 2C. Because the surface area of semiconductor substrate 18 surface is reduced from the second surface area to the third surface area, the pressure inside chamber 10 is reduced as was the case in the above described reaction and the opening of APC 22 is reduced (step S408). The variation in the opening of APC 22 is detected by CPU 28 and upon determining that the opening of APC 22 has become equal to or less than a predetermined degree of openness, CPU 28 is configured to send instructions to MFC 26 to change the gas flow rate from second gas flow rate 52b to third gas flow rate 52c. MFC 26 is configured to change the gas flow rate from second gas flow rate 52b to third gas flow rate 52c in the above described manner (step S409).

Next, formation of CVD film 48 progresses based on third gas flow rate 52c (step S410), and the formation is ended when reaching the desired thickness (step S411). The semiconductor device of the first embodiment is manufactured in the above described manner.

In the first embodiment described above, CPU 28 is capable of detecting the transition from the first state having the first surface area to the second state having the second surface area and the transition from the second state having the second surface area to the third state having the third surface area based on the opening of APC 22. As a result, CPU 28 is allowed to instruct MFC 26 to change the gas flow rate to a level which is suitable with the variation in the surface area of semiconductor substrate 18. More specifically, CPU 28 is capable of detecting the variation, i.e. decrease in the surface area of the surface of semiconductor substrate 18 by monitoring the opening of APC 22. It is thus, possible to control or adjust the flow rate of reaction gas to a level which is suitable with the variation in the surface area of semiconductor substrate 18 in real time. By controlling the supply of reaction gas to an appropriate flow rate for film formation in real time, it is possible to save excessive supply of gas which may amount to gas amount 56 indicated in FIG. 3 for example. It is thus, possible to reduce the supply of reaction gas and consequently reduce the manufacturing cost of the semiconductor device.

The first embodiment was described based on, but not limited to, an example in which tungsten was formed as CVD film 43. Different reactions may result depending upon the material being formed and/or reaction gases, etc. being used. Thus, the transitions from the first state to the second state and from the second state to the third state may take different forms from the examples described above. For instance, the opening of APC 22 may increase in some examples. The same is applicable to the second, third, and fourth examples described hereinafter.

Second Embodiment

In the first embodiment described above, variation in the surface area of semiconductor substrate 18 surface is detected by monitoring the opening of APC 22. The supply of gas is thereby controlled to an appropriate flow rate depending upon the variation in the surface area of semiconductor substrate 18 surface. In the second embodiment, the variation in the surface area of semiconductor substrate 18 surface is detected by detecting the variation, i.e. change, in the ratio of chemical species contained in exhaust gas 24.

As was the case in the first embodiment, suppose a total of 2000 sccm of reaction gas, containing 500 sccm of material gas ($WF_6$) and 1500 sccm of reduction gas ($H_2$), is supplied to semiconductor substrate 18 in the first state having the first surface area in the second embodiment. In such case, the reaction gases being fully consumed in the reaction taking place above semiconductor substrate 18 will produce 3000 sccm of HF. Thus, exhaust gas 24 resulting from the reaction will contain HF.

Next, when a transition is made to the second state having the second surface area as the formation of CVD film 48 progresses, amount of gas used in the reaction expressed by formula (1) amounts to 50 sccm of $WF_6$ and 150 sccm of $H_2$ when 500 sccm of $WF_6$ and 1500 sccm of $H_2$ are supplied. The reaction produces 300 sccm of HF. The reaction gases unconsumed in the reaction are exhausted as unreacted gas. In this example, a total of 1800 sccm of material gas containing 450 sccm of $WF_6$ and 1350 sccm of $H_2$ are unconsumed in the reaction. Thus, the flow rate of exhaust gas 24 amounts to a total of 2100 sccm containing 300 sccm of HF, 450 sccm of $WF_6$, and 1350 sccm of $H_2$. It is possible to detect the variation in the surface area of semiconductor substrate 18 surface by detecting the variation in the ratio of chemical species contained in exhaust gas 24. It is thus, possible to control the supply of gas to an appropriate flow rate in real time depending upon the variation in the surface area of semiconductor substrate 18 surface. The same is applicable when a transition is made from the second state having the second surface area to the third state having the third surface area.

The ratio of chemical species contained in exhaust gas 24 may be measured by a mass spectrometer. For example, the mass spectrometer may be disposed in exhaust tube 20 illustrated in FIG. 1 and connected to CPU 28 so that the measurements of the mass spectrometer may be monitored by CPU 28.

In the second embodiment described above, CPU 28 is capable of detecting the transition from the first state having the first surface area to the second state having the second surface area and the transition from the second state having the second surface area to the third state having the third surface area based on the ratio of chemical species contained in exhaust gas 24. As a result, CPU 28 is allowed to instruct MFC 26 to change the gas flow rate to a level which is suitable with the variation in the surface area of semiconductor substrate 18. More specifically, CPU 28 is capable of detecting the variation in the surface area of the surface of semiconductor substrate 18 by monitoring the ratio of chemical species contained in exhaust gas 24. The second embodiment is thus, capable of achieving the advantages similar to those of the first embodiment.

Third Embodiment

Next, a description will be given on a third embodiment. In the third embodiment, the variation in the surface area of semiconductor substrate 18 surface is detected by detecting the variation in the heater power of stage heater 14.

As described earlier, semiconductor device 120 makes a transition from the first state having the first surface area to the second state having the second surface area as the formation of CVD film 48 progresses. Stage heater 14 is configured to be capable of keeping the temperature of semiconductor substrate 18 constant. The amount of heat dissipation from semiconductor substrate 18 surface is reduced as the surface area of semiconductor substrate 18 is reduced. The reduced heat dissipation makes it difficult for the temperature of semiconductor substrate 18 to be lowered and thus, an adjustment is made to lower the heater power of stage heater 14. As a result, the heater power of stage heater 14 is reduced when the transition is made from the first state having the first surface area to the second state having the second surface area. Thus, it is possible to detect the variation in the surface area of semiconductor substrate 18 surface by detecting the variation in the heater power of stage heater 14. The supply of gas can be controlled to an appropriate flow rate depending upon the variation in the surface area of semiconductor substrate 18 surface.

The heater power of stage heater 14 is controlled for example by CPU 28. CPU 28 keeps track of the value of heater power supplied to stage heater 14. CPU 28 is capable of controlling MFC 26 by detecting the variation, i.e. change, in the value of heater power. For example, it is possible to determine that the value of heater power has been changed when for example three different values have been detected in a second-by-second monitoring of the heater power value. The same is applicable when a transition is made from the second state having the second surface area to the third state having the third surface area.

In the third embodiment described above, CPU 28 is capable of detecting the transition from the first state having the first surface area to the second state having the second surface area and the transition from the second state having the second surface area to the third state having the third surface area based on the detection of variation in the value of heater power. As a result, CPU 28 is allowed to instruct MFC 26 to change the gas flow rate to a level which is suitable with the variation in the surface area of semiconductor substrate 18. More specifically, CPU 28 is capable of detecting the variation in the surface area of the surface of semiconductor substrate 18 by monitoring the value of heater power. The third embodiment is thus, capable of achieving the advantages similar to those of the first embodiment.

Fourth Embodiment

Next, a description will be given on a fourth embodiment. In the fourth embodiment, variation in the surface area of semiconductor substrate 18 surface is detected by detecting the variation in the value of current being supplied for driving lifter pin 16 provided at the upper surface of stage heater 14. The value of current being supplied for driving lifter pin 16 is also hereinafter referred to as lifter drive current value.

In the fourth embodiment, lifter pin 16 is controlled so that semiconductor substrate 18 is spaced by a predetermined distance from the surface of stage heater 14. The distance between the surface of stage heater 14 and semiconductor substrate 18 may be less than 1 mm, for example. Thus, radiation heat coming from stage heater 14 will reach semiconductor substrate 18 and thereby allow temperature control of semiconductor substrate 18. Lifter pin 16 is capable of lifting semiconductor substrate 18 upward from the underside of semiconductor substrate 18. Lifter drive current value supplied to lifter pin 16 varies depending upon the weight of semiconductor substrate 18. For example, the lifter drive current value may become greater as the weight of semiconductor substrate 18 becomes heavier.

The speed of film formation along trenches 42, trenches 44, and surface 46 is substantially the same when CVD film 48 is formed by CVD. The speed of film formation may be defined as the thickness of film being formed in a given time period. Thus, the amount of film formation throughout semiconductor substrate 18 becomes greater as the surface area becomes greater. The amount of film formation may be measured by weight. Thus, the amount of increase in the weight of semiconductor substrate 18 in a given time period becomes greater as the surface area of semiconductor substrate 18 becomes greater and becomes smaller as the surface area of semiconductor substrate 18 becomes smaller. Thus, the amount of increase, i.e. the increasing gradient hereinafter also referred to as the gradient, in the lifter drive current value supplied to lifter pin 16 becomes greater as the surface area of semiconductor substrate 18 becomes greater.

Figure 7:
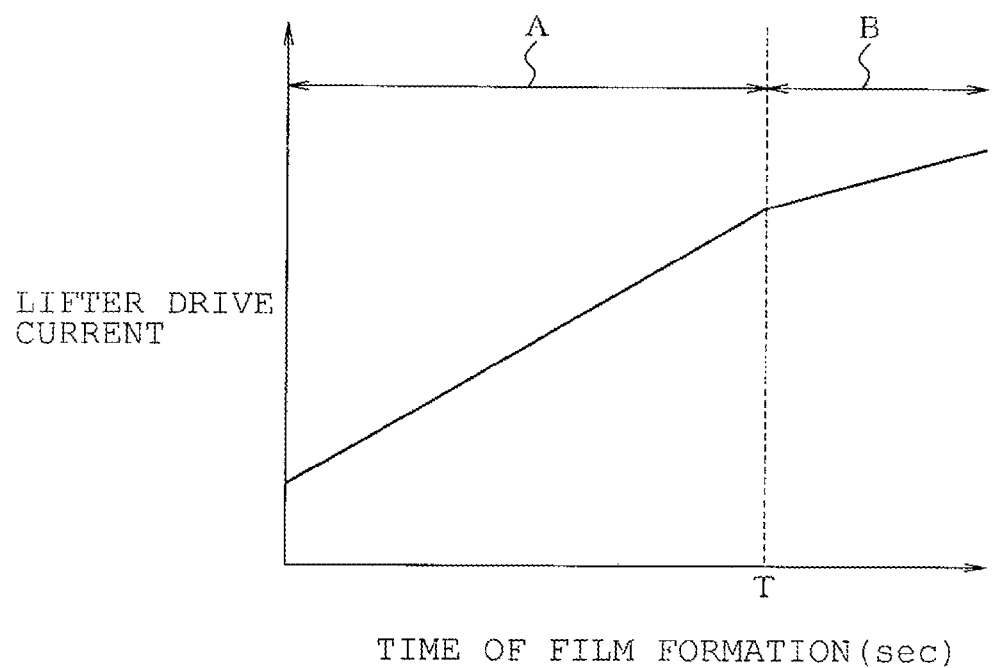
FIG. 7 is one example of a graph indicating a variation in a lifter drive current value related with time of film formation.

FIG. 7 is one example of a graph indicating the variation in the lifter drive current value supplied to lifter pin 16 related to time of film formation. The lateral axis represents the time of film formation and the vertical axis represents the lifter drive current value. In region A representing the first state having the first surface area, the gradient of the amount of film formation, i.e. the gradient of the amount of weight increase is large, being larger than region B for example. This is because the first surface area of the first state is large, being approximately 50 times the surface area of a flat semiconductor substrate 18 as mentioned in the example of the first embodiment. As a result, a large or steep gradient is observed in the amount of increase in the lifter drive current value supplied to lifter pin 16.

In contrast, in region B representing the second state having the second surface area, the gradient of the amount of film formation is small, being smaller than region A for example. This is because the second surface area of the second state is small, being approximately 5 times the surface area of a flat semiconductor substrate 18 as mentioned in the example of the first embodiment. As a result, a small or gradual gradient is observed in the amount of increase in the lifter drive current value supplied to lifter pin 16. The gradient of the lifter drive current value becomes smaller at time T when the transition is made from the first state to the second state. It is possible to detect the variation in the surface area of semiconductor substrate 18 surface by detecting the variation, i.e. change, in the gradient of the lifter drive current value. Thus, it is possible to control the supply of gas to an appropriate flow rate depending upon the variation in the surface area of semiconductor substrate 18 surface. The same is applicable to the transition from the second state having the second surface area and the third state having the third surface area.

Figure 6:
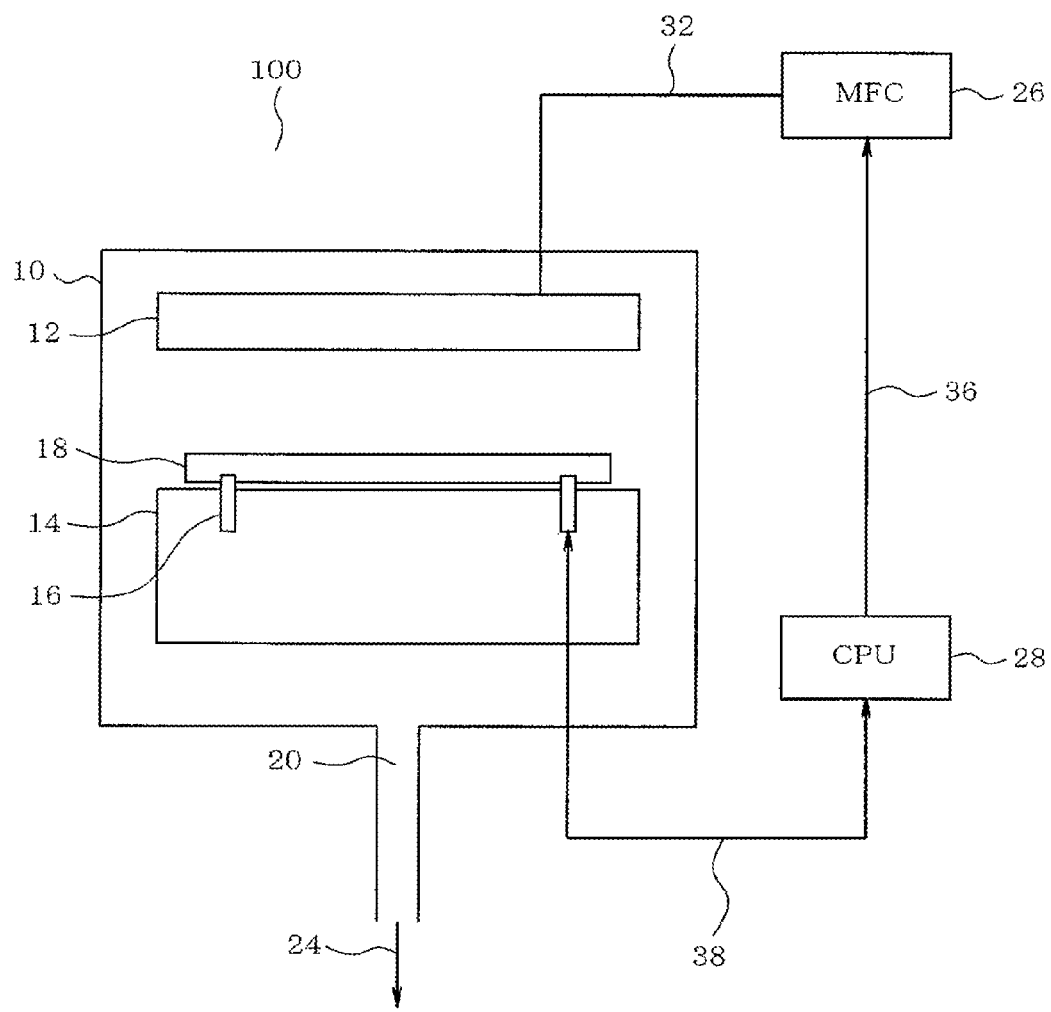
FIG. 6 pertains to a fourth embodiment and schematically illustrates one example of the structure of a semiconductor manufacturing apparatus.

FIG. 6 illustrates one example of the structure of semiconductor manufacturing apparatus 100 of the fourth embodiment. Lifter pin 16 is connected to CPU 28 by way of signal line 38. CPU 28 is configured to control lifter pin 16 through signal line 38. The lifter drive current value supplied to lifter pin 16 is controlled for example by CPU 28. Semiconductor manufacturing apparatus 100 is provided with lifter pin 16 or a mechanism not shown configured to detect the location of semiconductor substrate 18. The lifter drive current value is controlled by the above described configuration to enable a control to space semiconductor substrate 18 away from the surface of stage heater 14 by a predetermined distance. The lifter drive current value, used for controlling lifter pin 16 to space semiconductor substrate 18 away from the surface of stage heater 14 by a predetermined distance, varies depending on the weight of semiconductor substrate 18. For example, the lifter drive current value becomes greater as the weight of semiconductor substrate 18 becomes greater as illustrated in FIG. 7.

CPU 28 is configured to monitor the lifter drive current value and detect the variation in the surface area of semiconductor substrate 18 by detecting the variation in the gradient of the amount of increase in the lifter drive current value. As illustrated in FIG. 7, a change is observed in the gradient or the inclination of the straight line representing the lifter drive current value at time T. For example, a change in the gradient may be determined as follows. The lifter drive current value is detected every 1 second and the gradient of the lifter drive current value is detected for every 1 second. A change in the gradient is determined to have occurred when a different gradient value has been encountered for 3 consecutive times. The change in the gradient of the amount of increase of the lifter drive current value may be detected in the above described manner. CPU 28 is capable of controlling MFC 26 to specify an appropriate gas flow rate depending upon the variation in the surface area of semiconductor substrate 18 surface detected by detection of change in the gradient of the lifter drive current value.

in an alternative embodiment, semiconductor substrate 18 may be lifted away from the surface of stage heater 14 by lifter pin 16 at a regular interval of 1 second for example during the formation of CVD film 48 and the lifter drive current value measured at this timing may be monitored.

In the fourth embodiment described above, CPU 28 is capable of detecting the transition from the first state having the first surface area to the second state having the second surface area and the transition from the second state having the second surface area to the third state having the third surface area based on the detection of variation in the value of lifter drive current of lifter pin 16. As a result, CPU 28 is allowed to instruct MEC 26 to change the gas flow rate to a level which is suitable with the variation in the surface area of semiconductor substrate 18. More specifically, CPU 28 is capable of detecting the variation in the surface area of the surface of semiconductor substrate 18 by monitoring the value of lifter drive current. The fourth embodiment is thus, capable of achieving the advantages similar to those of the first embodiment.

OTHER EMBODIMENTS

The embodiments described above may be applied to various type of semiconductor devices including storage devices such as a NAND type or a NOR type flash memory, EPROM, DRAM, and SRAM; and logic devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A method of manufacturing a semiconductor device, comprising:
   forming a film along a surface of a semiconductor substrate in a first surface area state having a first surface area by supplying a reaction gas at a first flow rate;

detecting a transition from the first surface area state to a second surface area state having a second surface area different from the first surface area; and forming the film by changing the flow rate of the reaction gas from the first flow rate to a second flow rate different from the first flow rate after detecting the transition from the first surface area state to the second surface area state, wherein forming the film at the first flow rate and forming the film at the second flow rate are performed in a film formation apparatus provided with a reaction chamber and an automatic pressure controller connected to the reaction chamber, and wherein detecting the transition from the first surface area state to the second surface area state is achieved by detecting a variation in a degree of openness of the automatic pressure controller.

2. The method according to claim 1, wherein forming the film at the first flow rate and forming the film at the second flow rate gradually fill a trench formed into a surface of the film pre-deposited on the semiconductor substrate to change a surface area of the surface of the semiconductor substrate.

3. The method according to claim 2, wherein forming the film at the first flow rate and forming the film at the second flow rate progress conformally along a surface of the trench until the trench is filled, and the method further comprises forming the film with a temperature of the semiconductor substrate elevated after filling the trench.

4. The method according to claim 2, further comprising detecting a transition from the second surface area state to a third surface area state having a third surface area different from the second surface area; and forming the film by changing the flow rate of the reaction gas from the second flow rate to a third flow rate different from the second flow rate after detecting the transition from the second surface area state to the third surface area state, wherein the third surface area is substantially equal to a surface area of a flat surface of the semiconductor substrate on which the film is formed.

5. The method according to claim 1, wherein the first surface area is greater than the second surface area, and wherein the first flow rate is greater than the second flow rate.

6. The method according to claim 1, wherein the reaction gas includes at least tungsten hexafluoride and hydrogen.

7. A method of manufacturing a semiconductor device comprising:

forming a film along a surface of a semiconductor substrate in a first surface area state having a first surface area by supplying a reaction gas at a first flow rate;

detecting a transition from the first surface area state to a second surface area state having a second surface area different from the first surface area; and forming the film by changing the flow rate of the reaction gas from the first flow rate to a second flow rate different from the first flow rate after detecting the transition from the first surface area state to the second surface area state, wherein detecting the transition from the first surface area state to the second surface area state is achieved by detecting a variation in a ratio of chemical species contained in an exhaust gas discharged from a reaction chamber of a film formation apparatus.

8. The method according to claim 7, wherein forming the film at the first flow rate and forming the film at the second flow rate gradually fill a trench formed into a surface of the film pre-deposited on the semiconductor substrate to change a surface area of the surface of the semiconductor substrate.

9. The method according to claim 8, wherein forming the film at the first flow rate and forming the film at the second flow rate progress conformally along a surface of the trench until the trench is filled, and the method further comprises forming the film with a temperature of the semiconductor substrate elevated after filling the trench.

10. The method according to claim 8, further comprising detecting a transition from the second surface area state to a third surface area state having a third surface area different from the second surface area; and forming the film by changing the flow rate of the reaction gas from the second flow rate to a third flow rate different from the second flow rate after detecting the transition from the second surface area state to the third surface area state, and wherein the third surface area is substantially equal to a surface area of a flat surface of the semiconductor substrate on which the film is formed.

11. The method according to claim 7, wherein the first surface area is greater than the second surface area, and wherein the first flow rate is greater than the second flow rate.

12. The method according to claim 7, wherein the reaction gas includes at least tungsten hexafluoride and hydrogen.

13. A method of manufacturing a semiconductor device comprising:

forming a film along a surface of a semiconductor substrate in a first surface area state having a first surface area by supplying a reaction gas at a first flow rate;

detecting a transition from the first surface area state to a second surface area state having a second surface area different from the first surface area; and forming the film by changing the flow rate of the reaction gas from the first flow rate to a second flow rate different from the first flow rate after detecting the transition from the first surface area state to the second surface area state, wherein forming the film at the first flow rate and forming the film at the second flow rate are performed in a film formation apparatus provided with a reaction chamber, a stage being disposed inside the reaction chamber and allowing placement of a semiconductor substrate, and a lifter being provided at the stage and being capable of lifting the semiconductor substrate, and wherein detecting the transition from the first surface area state to the second surface area state is achieved by detecting a variation in a drive current value for driving the lifter.

14. The method according to claim 13, wherein forming the film at the first flow rate and forming the film at the second flow rate gradually fill a trench formed into a surface of the film pre-deposited on the semiconductor substrate to change a surface area of the surface of the semiconductor substrate.

15. The method according to claim 14, wherein forming the film at the first flow rate and forming the film at the second flow rate progress conformally along a surface of the trench until the trench is filled, and further comprising forming the film with a temperature of the semiconductor substrate elevated after filling the trench.

16. The method according to claim 14, further comprising detecting a transition from the second surface area state to a third surface area state having a third surface area different from the second surface area; and forming the film by changing the flow rate of the reaction gas from the second flow rate to a third flow rate different from the second flow rate after detecting the transition from the second surface area state to the third surface area state, and wherein the third surface area is substantially equal to a surface area of a flat surface of the semiconductor substrate on which the film is formed.

17. The method according to claim 13, wherein the first surface area is greater than the second surface area, and wherein the first flow rate is greater than the second flow rate.

18. The method according to claim 13, wherein the reaction gas includes at least tungsten hexafluoride and hydrogen.

\* \* \* \* \*